(12) United States Patent  (10) Patent No.: US 7,090,471 B2
Xie et al.                   (45) Date of Patent:    Aug. 15, 2006

(54) INTEGRATED ELECTROSTATIC PERISTALTIC PUMP METHOD AND APPARATUS

(75) Inventors: Jun Xie, Pasadena, CA (US); Jason Shih, Yorba Linda, CA (US); Yu-Chong Tai, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/757,973

(22) Filed: Jan. 13, 2004

(65) Prior Publication Data

US 2004/0253123 A1    Dec. 16, 2004

Related U.S. Application Data

(60) Provisional application No. 60/440,153, filed on Jan. 15, 2003.

(51) Int. Cl.
*F04B 17/03*  (2006.01)
*E03B 1/00*  (2006.01)

(52) U.S. Cl. ............... 417/53; 417/413.3; 137/607
(58) Field of Classification Search ............... 417/53, 417/322, 413.3; 137/605, 607, 609, 612
See application file for complete search history.

(56) References Cited

U.S. PATENT DOCUMENTS

| | | | |
|---|---|---|---|
| 4,581,624 A * | 4/1986 | O'Connor | 251/129.06 |
| 5,836,750 A | 11/1998 | Cabuz | |
| 6,033,191 A | 3/2000 | Kamper et al. | |
| 6,062,256 A | 5/2000 | Miller et al. | |
| 6,109,889 A | 8/2000 | Zengerle et al. | |
| 6,116,863 A * | 9/2000 | Ahn et al. | 417/322 |
| 6,124,632 A | 9/2000 | Lo et al. | |
| 6,126,140 A | 10/2000 | Johnson et al. | |
| 6,149,123 A | 11/2000 | Harris et al. | |
| 6,206,022 B1 | 3/2001 | Tsai et al. | |
| 6,240,962 B1 | 6/2001 | Tai et al. | |
| 6,277,257 B1 | 8/2001 | Paul et al. | |
| 6,408,878 B1 | 6/2002 | Unger et al. | |
| 6,536,213 B1 | 3/2003 | Tai et al. | |
| 6,568,910 B1 | 5/2003 | Parce | |
| 6,572,749 B1 | 6/2003 | Paul et al. | |
| 6,626,416 B1 | 9/2003 | Sharma et al. | |
| 6,682,318 B1 * | 1/2004 | Takeuchi et al. | 417/322 |
| 6,786,708 B1 * | 9/2004 | Brown et al. | 417/413.3 |
| 2004/0101422 A1 * | 5/2004 | Correale | 417/322 |

OTHER PUBLICATIONS

Shih, J., et al., "Surface Micromachined and Integrated Capacitive Sensors For Microfluidic Applications", Trasducers 2003, USA, pp. 388-391 (2003).
Xie, J., et al., "Integrated Surface-Micromachined Mass Flow Controller", MEMS 2003, Kyoto, Japan, pp. 20-23 (2003).

(Continued)

*Primary Examiner*—Charles G. Freay
(74) *Attorney, Agent, or Firm*—Foley & Lardner LLP

(57) ABSTRACT

An electrostatic fluid regulating device and methods. The device has a substrate. The device also has a first electrode coupled to the substrate. The device has a polymer based diaphragm. A second electrode is coupled to the diaphragm. A polymer based fluid chamber is coupled to the diaphragm. The device also has an inlet coupled to the polymer based fluid chamber and an outlet coupled to the polymer based fluid chamber.

27 Claims, 7 Drawing Sheets

OTHER PUBLICATIONS

Degani et al., On the Effect of Residual Charges on the Pull-in Parameters of Electrostatic Actuators, Sensors and Actuators A 97-98 (2002), pp. 563-568.

Dubois et al., Electrostatically Actuated Gas Microvalve Based on A Ta—Si—N Membrane, Institute of Microtechnology, University of Nuchatel, Switzerland, 2001, pp. 535-538.

Galambos et al., A Surface Micromachined Electrostatic Drop Ejector, Transducers 2001, Munich, Germany.

Grosjean et al., A Thermopneumatic Peristaltic Micropump Transducers, 1999, pp. 1776-1779.

Judy et al., Micromechanical Membrane Pump, MEMS 1991, pp. 182-186.

Kovacs, G.T.A., Micro Machined Transducers Sourcebook, McGraw-Hill, 1998.

Sethu et al., Polymer Based Actuator for Nozzle-Diffuser Pumps In Plastic Microfluidic Systems, 2002, pp. 232-328.

Tsai et al., A Thermal Bubble Actuated Micro Nozzle-Diffuser Pump, MEMS 2001, pp. 409-412.

Wu et al., Electrochemical Time of Flight Flow Sensor, Sensors and Actuators, A 97-98 (2002), pp. 68-74.

Vandelli et al., Development of a MEMS Microvalve Array for Fluid Flow Control, Journal of Microelectromechanical Systems, vol. 7, No. 4, Dec. 1998, pp. 395-403.

Wijngaart et al., A High-Storke, High-Pressure Electrostatic Actuator for Valve Applications, Sensors and Actuators, A 100 (2002), pp. 264-271.

Yao et al., Dielectric Charging Effects on Parylene Electrostatic Actuators, IEEE, 2002, pp. 614-617.

* cited by examiner

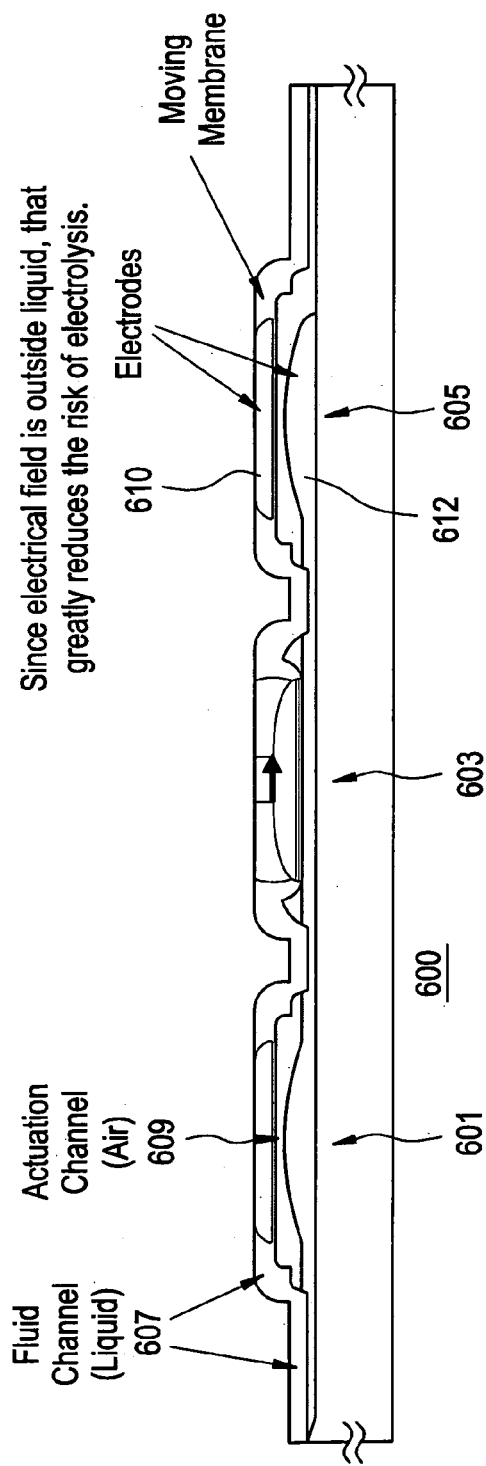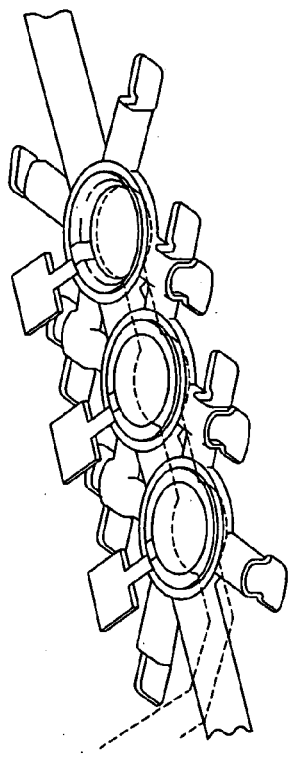

3 Phase Actuation

INTEGRATED ELECTROSTATIC PERISTALTIC PUMP METHOD AND APPARATUS

CROSS-REFERENCES TO RELATED APPLICATIONS

This application claims priority to U.S. Provisional patent application No. 60/440,153 filed Jan. 15, 2003, commonly assigned, incorporated by reference herein for all purposes.

STATEMENT AS TO RIGHTS TO INVENTIONS MADE UNDER FEDERALLY SPONSORED RESEARCH OR DEVELOPMENT

Work described herein has been supported, in part, by the NSF ERC Center at the California Institute of Technology (Grant No. EEC-9402726) and the DARPA/MTO Bioflips program. The United States Government may therefore have certain rights in the invention.

BACKGROUND OF THE INVENTION

The present invention relates generally to micro fabrication techniques. More particularly, the invention provides a method and device for manufacturing a fluidic pumping device using a micromachining method and apparatus. Merely by way of example, the invention has been applied to the manufacture of a polymer based fluidic pumping device using electrostatic energy. But it would be recognized that the invention has a much broader range of applicability. For example, the invention can be applied to other applications.

A Micro-Electro-Mechanical System, commonly called MEMS, is generally a batch-fabricated (micro fabricated) system that includes both electrical and mechanical elements. MEMS elements often have characteristic sizes ranging from nanometers to millimeters. MEMS often makes possible certain systems that are smaller, faster, more economical, and energy efficient in some cases. In a general MEMS system, the electrical portion includes integrated circuits, which forms the thinking part, while the electromechanical portion works with the thinking part to control functions and perception.

MEMS generally includes micro sensors and actuator devices. Micro sensors often gather outside information such as thermal, biological, optical, gravitational, and others. Actuators often respond to user based information to control their environment. As merely an example, fluidic pumping devices are common examples of MEMS. Such pumping device often rely upon external fluidic drive sources to selectively move fluids through various channel regions. These external drive sources are often cumbersome and lead to inefficiencies. Other pumping devices use drive forces such as electrophoresis. Electrophoresis relies upon a pair of electrodes that are in direct contact with the working fluid. As such, electrophoresis has many limitations. These and other limitations can be found throughout the present specification and more particularly below.

Conventional micro pumps are either bulk micro machined or power thirsty or complexly packaged so they are not suitable for total system integration. Examples have been illustrated in G. T. A Kovacs, "Micro machined Transducers Sourcebook", McGraw-Hill (1998); P. Sethu and C. H. Mastrangelo, "Polymer based Actuator for nozzle-diffuser pumps in Plastic Microfluidic Systems", pp325–328 (2002); J. H. Tsai and L. W. Lin, "A Thermal Bubble Actuated Micro Nozzle-Diffuser Pump", MEMS 2001, pp. 409–412; J. W. Judy, T. Tamagawa and D. L. Polla, "Micromechanical Membrane Pump", MEMS 1991, pp.182–186; and C. Grojean, X. Yang and Y. C. Tai, "A Thermopneumatic Peristaltic Micropump", Transducers, pp1776–1779 (1999).

From the above, it is seen that techniques for manufacturing improved MEMS devices is highly desirable.

BRIEF SUMMARY OF THE INVENTION

According to the present invention, techniques for micro fabrication are provided. More particularly, the invention provides a method and device for manufacturing a fluidic pumping device using a micromachining method and apparatus. Merely by way of example, the invention has been applied to the manufacture of a polymer based fluidic pumping device using electrostatic energy. But it would be recognized that the invention has a much broader range of applicability. For example, the invention can be applied to other applications.

An embodiment of an electrostatic fluid regulating device in accordance with one embodiment of the present invention comprises a plurality of fluid regulating elements numbered from 1 through N disposed on a substrate. Each of the fluid regulating elements comprises a fluid channel comprising an inlet at a first end and an outlet at a second end, the fluid channel being disposed overlying the substrate. An actuation region is disposed overlying the substrate and coupled to the fluid channel. A polymer based diaphragm is coupled between the fluid channel and the actuation region. A first electrode is coupled to the substrate and to the actuation region. A second electrode is coupled to the polymer based diaphragm. An electrical power source is coupled between the first electrode and the second electrode, and substantially free from causing an electric field within the fluid channel region, wherein the first electrode and the second electrode are physically separated from each other by at least the actuation region, and are coupled when a potential difference arises between them.

An embodiment of a method in accordance with the present invention for fabricating a micro fluidic device, comprises, providing a substrate, patterning a first electrode layer to form a plurality of first electrode elements overlying the substrate, and forming a first polymer based layer overlying the plurality of first electrode elements. A first sacrificial layer is formed overlying the first polymer based layer. A second polymer based layer is formed overlying the first sacrificial layer. A second electrode layer is patterned to form a plurality of second electrode elements over the second polymer based layer, each of the second electrode elements being associated with respective first electrode elements. A third polymer based layer is formed overlying the plurality of second electrode elements to sandwich the plurality of second electrode elements between the second polymer based layer and the third polymer based layer. A second sacrificial layer is formed overlying the third polymer based layer. A fourth polymer based layer is formed overlying the second sacrificial layer. The first sacrificial layer is released between the first polymer based layer and the second polymer based layer, and the second sacrificial layer is released between the third polymer based layer and the fourth polymer based layer.

An embodiment of a method in accordance with the present invention for flowing a fluid, comprises, providing an electrostatic fluid regulating device comprising a plurality of fluid regulating elements numbered from 1 through N disposed on a substrate. Each of the fluid regulating elements comprises, a fluid channel comprises an inlet at a first end and an outlet at a second end, the fluid channel being disposed overlying the substrate, an actuation region disposed overlying the substrate and coupled to the fluid channel, a polymer based diaphragm coupled between the fluid channel and the actuation region, a first electrode coupled to the substrate and to the actuation region, and a second electrode coupled to the polymer based diaphragm, such that the first electrode and the second electrode are physically separated from each other by at least the actuation region. Electrical power is applied from a source in a sequence to create a potential difference between the first and second electrodes of first, second, and third fluid regulating elements in turn. The first and second electrodes are coupled when a potential difference arises between them such that contents of the fluid channel region are substantially free from an applied electric field.

Numerous benefits are achieved using the present invention over conventional techniques, depending upon the embodiment. In a specific embodiment, the present invention can be implemented using conventional process technologies. Preferably, the invention provides a pumping system and method that does not apply electric fields to the working fluid. In certain embodiments, the present system and method also provide an integrated source for fluid actuation, which allows for integrated lab on chip applications. Electrostatic actuation in accordance with embodiments of the present invention also offers the advantages of ease of implementation in a microscale system, and efficient power consumption, the latter being a particularly important characteristic of portable applications. Depending upon the embodiment, one or more of these benefits may be achieved. These and other benefits are provided throughout the present specification and more particularly below.

Various additional features and advantages of the present invention can be more fully appreciated with reference to the detailed description and accompanying drawings that follow.

BRIEF DESCRIPTION OF THE DRAWINGS

FIG. 6 is a simplified cross-sectional view diagram of a peristaltic pump according to an embodiment of the present invention;

FIG. 6A is a simplified perspective view of the pump shown in FIG. 6;

DETAILED DESCRIPTION OF THE INVENTION

Figure 1:
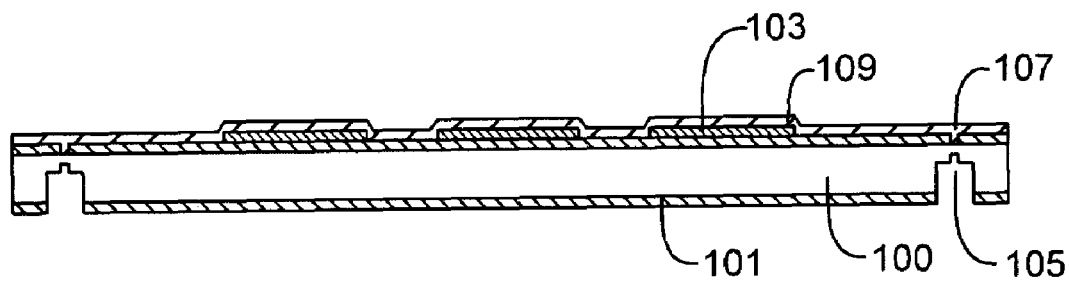
FIGS. 1–5 are simplified cross-sectional view diagrams illustrating a method for fabricating a beam pump structure according to an embodiment of the present invention.

According to the present invention, techniques for micro fabrication are provided. More particularly, the invention provides a method and device for manufacturing a fluidic pumping device using a micromachining method and apparatus. Merely by way of example, the invention has been applied to the manufacture of a polymer based fluidic pumping device using electrostatic energy. But it would be recognized that the invention has a much broader range of applicability. For example, the invention can be applied to other applications.

A method for fabricating a micro fluidic pumping device can be outlined as follows:

1. Provide a support substrate including backside and front side, e.g., silicon wafer;
2. Form an oxide layer (or other dielectric material layer or multi-layers) overlying the surfaces of the substrate;
3. Form a photolithographic pattern overlying the oxide layer;
4. Define openings in the oxide layer using the photolithographic pattern to pattern the backside of the substrate;
5. Deposit electrode layer overlying the front side of the substrate;
6. Pattern electrode layer to form a plurality of electrode structures;
7. Form first polymer based layer overlying the plurality of electrode structures;
8. Form silicon layer overlying the first polymer based layer;
9. Form first sacrificial layer overlying the patterned silicon layer;
10. Form second polymer based layer overlying the sacrificial layer;
11. Pattern second polymer based layer;
12. Form second electrode layer overlying the second polymer based layer;
13. Form third polymer based layer overlying the second electrode layer;
14. Form second sacrificial layer overlying the third polymer based layer;
15. Form fourth polymer based layer overlying the second sacrificial layer;
16. Open backside regions to the sacrificial layers;
17. Release sacrificial layers; and
18. Perform other steps, as desired.

The above sequence of steps provide a method of fabricating a beam structure of polymer based material using micromachining techniques. As shown, the method uses a combination of front side patterning and backside patterning according to a specific embodiment. The method forms a pump device that is composed of multiple polymer based materials. Preferably, the polymer based material is a Parylene material such as Parylene-C, but can be others. Additionally, certain steps may be combined, one or more steps may be added, and one or more steps may be removed, depending upon the embodiment. The sequence of the steps is changed in certain embodiments. Further details of the present method can be found throughout the present specification and more particularly below.

FIGS. 1–5 are simplified cross-sectional view diagrams illustrating a method for fabricating a fluid regulating device according to an embodiment of the present invention. These diagrams are merely illustrations, which should not unduly limit the scope of the claims herein. One of ordinary skill in the art would recognize many variations, alternatives, and modifications.

As shown in FIG. 1, the method begins by providing a support substrate structure 100, e.g., silicon wafer, glass substrate, which has a surface and a thickness defined underlying the surface. The structure also includes an oxide layer 103 overlying the surface of the substrate. The surface includes front side and backside. Although such oxide layer has been illustrated, such layer or layers may also include nitrides, a combination of oxide and nitride, and others, which serve as a hard mask to protect surfaces of the substrate. Preferably, oxide layer 103 is formed using wet oxidation techniques such as steam oxidation and/or wet dipping, as well as others. Of course, one of ordinary skill in the art would recognize many variations, modifications, and alternatives.

The method forms a photolithographic pattern overlying the oxide layer. The pattern is often formed by coating the surface with a photosensitive material, which is exposed and then developed. Openings are formed in the photosensitive material. Such openings correspond to trench regions or recessed regions to be formed in the substrate. Etching techniques are often used to form openings in the oxide layer to expose substrate region, which will be subjected to reactive ion etching processes or other directional etching processes. Preferably, deep reactive ion etching (DRIE), is used to form openings 105, as illustrated by FIG. 1, to define recessed regions or trenches, including sides and lower portions. The recessed regions extend toward the front surface of the substrate.

The method patterns an electrode layer 109 overlying the surface of the oxide, as shown. The electrode layer is often a conductive material, such as a single layer or multiple layers. As merely an example, the conductive material can be Cr/Au material that is deposited. Other materials such can also be used. The electrode layer is often provided to a predetermined thickness. Preferably, the Cr/Au is deposited to a thickness of between about 100–3000 Å. The electrode layer is patterned to form a plurality of electrode regions, which are separated from each other in preferred embodiments. The electrode layer has been or will be coupled to a voltage potential once the device has been completed.

The method forms a thickness of polymer based material 107 overlying the oxide layer. The polymer based material grows on the exposed surfaces of the substrate, oxide, and electrode. Preferably, the polymer based material is Parylene, which is a commercial name for polymers that belong to a chemical family called poly-para-Xylylene. In the specific embodiment illustrated in FIG. 1, Parylene having a thickness of approximately 1 μm is formed.

Parylene is often deposited using gaseous monomers. Such monomers are polymerized and deposited on the substrate, including the trench region, as a pinhole-free and stress-free solid film with selected physical, thermal, electrical, barrier, and biocompatible properties. As shown, Parylene is a conformal protective polymer coating material that conforms to surfaces of the substrate, oxide, and electrode. Parylene exhibits dielectric strength, high surface and volume resistivities, and electrical properties that may be independent of temperature. It also provides a substantially conformal, pinhole-free coating that is corrosion resistance and provides dielectric protection. Before going to the next step, we shall briefly discuss deposition techniques of Parylene using a vacuum chemical vapor deposition process.

Parylene is often applied at a molecular level by a vacuum deposition process at ambient temperature or other temperatures. The vacuum deposition process includes a vaporizer, a pyrolysis, and a deposition chamber. The deposition chamber is often coupled to cold trap, which is coupled to vacuum pump. The vacuum pump maintains vacuum in the chamber. Parylene can be applied at room temperature with certain vacuum deposition equipment that permits control of coating rate and thickness. The deposition process takes place at the molecular level as the chemical, in dimer form, is converted under vacuum and heat to dimeric gas, pyrolized to cleave the dimer, and deposited as a clear polymer film. Depending upon the embodiment, Parylene may come in one of a variety of forms such as Parylene C, Parylene N, and Parylene D, which correspond to three dimer variations. Each of the dimer variations could be suited to the requirements of a specific embodiment. Preferably, Parylene C is desirable. Further details of the deposition apparatus and characteristics of Parylene can be found at the website of Conformal-Coating.com. Of course, there can also be other variations, modifications, and alternatives.

Figure 2:
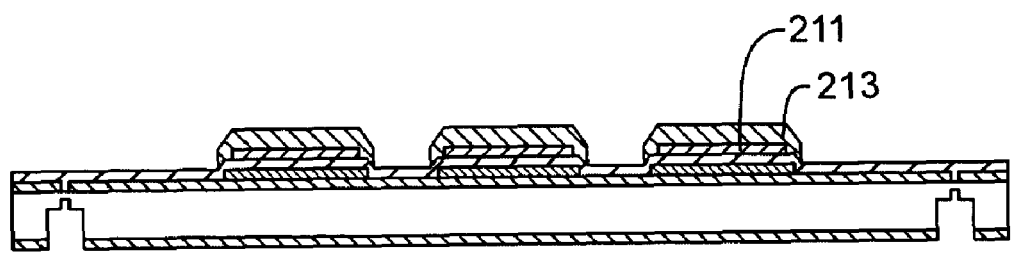

Referring now to FIG. 2, the method includes forming a silicon layer 211. The silicon layer can be formed using chemical vapor deposition or other techniques. Preferably, the silicon layer is provided at low temperature. In the specific embodiment shown in FIG. 2, a silicon layer having a thickness of approximately 3000 Å is formed by physical vapor deposition (sputtering). The silicon layer is patterned to remain over portions of the polymer based material overlying the electrodes.

Next, the method form a sacrificial layer 213 overlying the silicon layer. The sacrificial layer is preferably any material that can be easily removed at a later process. Preferably, the sacrificial layer is a polymer based material that can dissolve. Such material can be photoresist or other like material. The sacrificial layer is patterned to occupy a region corresponding to an actuation chamber for the present device. In the specific embodiment shown in FIG. 2, a photoresist layer having a thickness of about 4 μm is patterned.

Figure 3:
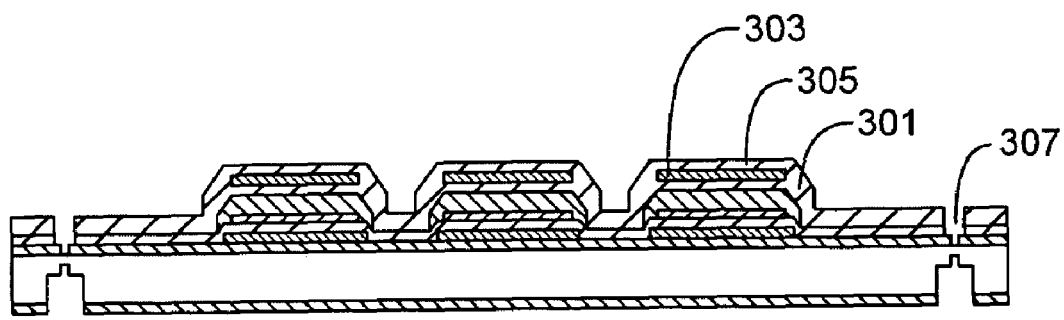

Turning now to FIG. 3, the method forms a sandwiched structure that includes a second electrode element. The sandwiched structure includes a first polymer based material 301, overlying electrode material 303, and an overlying polymer based material 305. Preferably, the polymer based material is Parylene, and materials 301 and 305 are deposited in the manner described above.

As shown in FIG. 3, the electrode material is sandwiched between the polymer based materials 301 and 305. In the specific embodiment shown in FIG. 3, patterned second electrodes comprising Cr/Au (100 Å/1500 Å) are sandwiched between Parylene layers having thicknesses of about 1 μm.

An opening 307 is formed overlying the substrate within the polymer based materials. The opening will be used to release an overlying sacrificial layer, which will be applied for the fluidic chamber.

Figure 4:
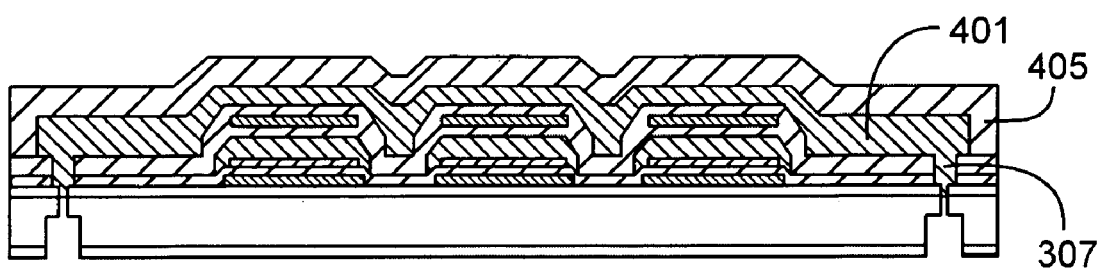

Referring now to FIG. 4, the method includes forming a sacrificial layer 401 overlying the sandwiched structure. The sacrificial layer is preferably any material that can be easily removed at a later process. Preferably, the sacrificial layer is a polymer based material that can dissolve. Such material can be photoresist or other like material.

The sacrificial layer will occupy a region corresponding to a fluid chamber for the present device. As shown, the sacrificial layer 407 extends to opening 307, which will be used to introduce solvent to release the sacrificial layer. In the specific embodiment shown in FIG. 4, a photoresist layer having a thickness of about 5 μm is formed.

Overlying the sacrificial layer is a polymer based material 405. Preferably, the polymer based material is Parylene. In the specific embodiment shown in FIG. 4, a Parylene layer having a thickness of about 4 µm is formed.

Figure 5:
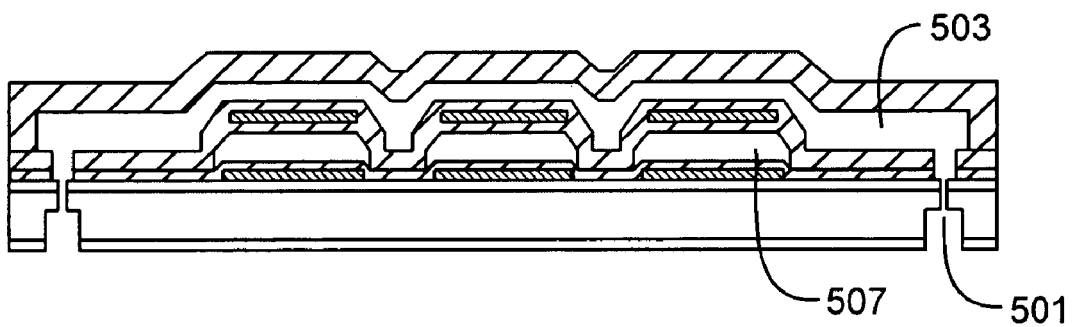

The method then releases the sacrificial layers, as illustrated by FIG. 5. First, an etching process removes material from the backside of the substrate to form an opening 501, which extends through the substrate and exposes the sacrificial material. Once the sacrificial material has been exposed, solvents and/or etchants are used to dissolve the sacrificial layers and remove them from actuation chamber region 507 and fluid chamber region 503.

In accordance with one specific embodiment wherein the sacrificial material comprises photoresist, this material is removed by exposure to acetone. Prolonged Acetone soaking, however, may result in delamination between Parylene layers. So as soon as most of photoresist is dissolved, the chips were transferred to Isopropyl Alcohol (IPA) for further cleaning.

Once the photoresist sacrificial layer has been removed by exposure to liquid acetone and IPA, the silicon sacrificial material is removed by exposure to a gaseous etchant such as $BrF_3$. In this embodiment, the role of the silicon sacrificial layer is to provide the final release of the membrane in a gaseous environment, without resulting stiction produced by release in a liquid environment.

Further details of the present device including additional fabrication techniques can be found throughout the present specification and more particularly below.

FIG. 6 is a simplified diagram of a peristaltic pump 600 according to an embodiment of the present invention. This diagram is merely an example, which should not unduly limit the scope of the claims herein. One of ordinary skill in the art would recognize many variations, alternatives, and modifications.

As shown in FIG. 6, embodiments in accordance with the present invention provide an electrostatic fluid regulating device comprising a plurality of fluid regulating elements numbered from 1 through N 601, 603, 605 disposed on a substrate. Each of the fluid regulating elements has a fluid channel 607. Such fluid channel comprises an inlet at a first end and an outlet at a second end. The fluid regulating element has an actuation region 609 disposed overlying the substrate and coupled to the fluid channel and a polymer based diaphragm (e.g., Parylene) coupled between the fluid channel and the actuation region.

A first electrode 610 is coupled to the actuation region and is coupled to the substrate. A second electrode 612 is coupled to the polymer based diaphragm and is coupled to the first electrode. A power source is coupled between the first electrode and the second electrode and is substantially free from causing an electric field within a portion of the fluid channel region. The first electrode and the second electrode are physically separated from each other by at least the actuation region.

FIG. 6A shows a perspective view of the structure shown in cross-section in FIG. 6.

Figure 7A:
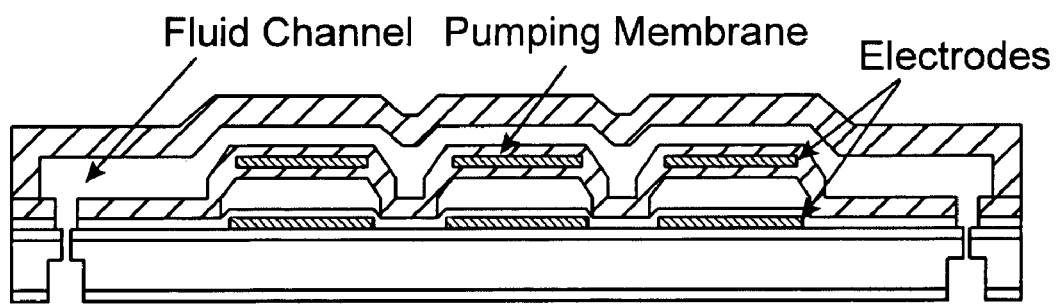
FIG. 7A is a simplified diagram of a valve device according to an embodiment of the present invention.
Figure 7B:
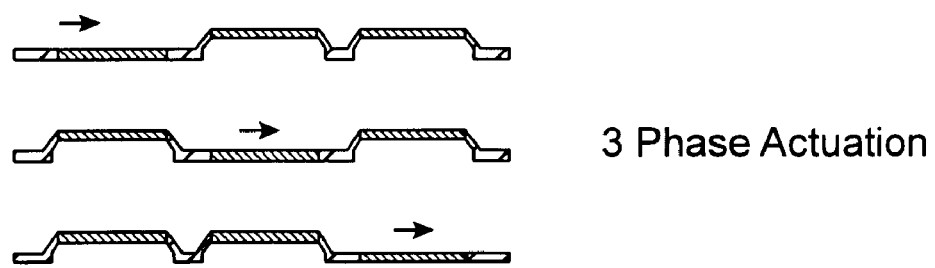
FIG. 7B is a simplified schematic diagram showing the order of actuation of the electrodes of the device of FIG. 7A in order to achieve peristaltic pumping.

FIGS. 7A–B shows the design and operation principle of the pump device. This diagram is merely an example, which should not unduly limit the scope of the claims herein. One of ordinary skill in the art would recognize many variations, alternatives, and modifications.

FIG. 7A is a simplified schematic diagram of the pumping structure shown in FIGS. 6–6A. Each pumping chamber has an electrostatic actuator at the bottom and a fluid chamber on top. Liquid exists in the top chamber while air is in the actuator gap.

FIG. 7B shows the three-phase actuation of the electrodes. The sequence of this three-phase actuation produces a peristaltic pumping action.

Embodiments in accordance with the present invention offer a number of advantages over conventional MEMS-type devices. One important advantage is that the electrodes are not positioned on either side of the chamber containing the fluid to be flowed. Rather, the electrodes are positioned on one side of this fluid flow chamber, on either side of an actuation chamber.

Thus as shown and illustrated in the above figures, electronic actuation of the diaphragm member is not necessarily accompanied by imposing an electric field across the contents of the flow chamber. This can be beneficial to avoid electrolysis of the fluidic contents of the flow channel. This can also be beneficial in avoiding the deleterious effects of imposing such a field upon contents of the flow chamber that may be sensitive to such an applied field, for example cells or electrically polar tags or solvents.

Experiments:

To prove the principle and operation of the present invention, we performed various experiments. These experiments are merely examples, which should not unduly limit the scope of the claims herein. One of ordinary skill in the art would recognize many other variations, modifications, and alternatives. Further details of the present experiments can be found throughout the present specification and more particularly below.

Here we presented a totally integrated electrostatic peristaltic pump for lab-on-chip applications. Such pump was produced by the present Parylene platform technology that can also produce many other devices like valves and flow sensors. Certain details of the present pump can be found throughout the present specification and more particularly below.

The following experimental results relate to a 4-Parylene-layer surface-micromachining platform technology and its application for an electrostatic peristaltic micro pump. Four layers of CVD Parylene were used, while normal photoresist was used for the sacrificial layer and Cr/Au the metal layers. The present process enables a peristaltic pump design, in which an electrical field does not exist inside the working fluid. Testing of an electrostatic actuator showed a pull-in voltage of 150V for a 200-µm-diameter membrane. For pumping, 3 and 6-phase peristaltic actuations were used and pumping of either water or ethanol has been demonstrated. A maximum pumping rate of 2 nanoliters/min was achieved at 60 Hz for ethanol.

Figure 8:
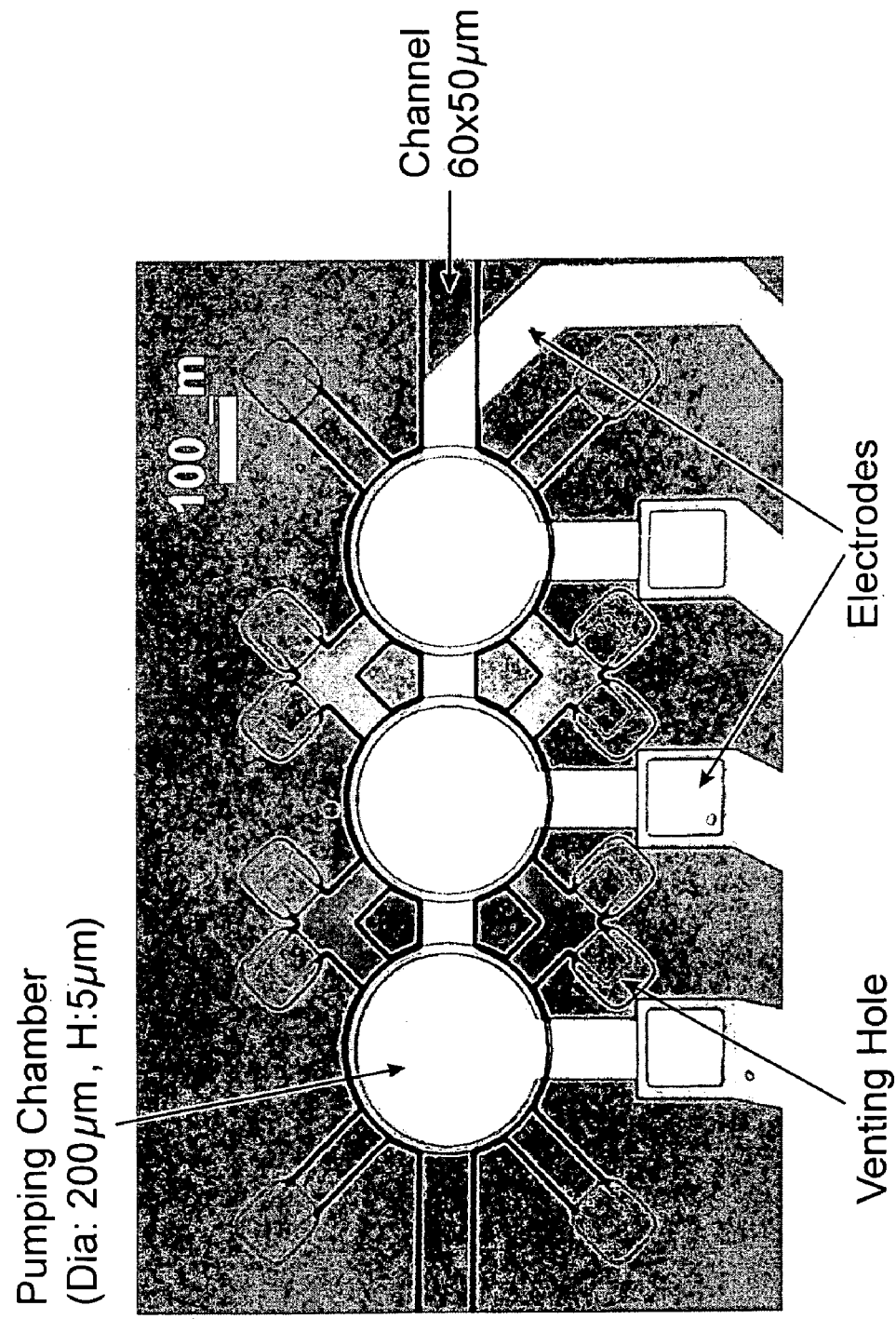
FIG. 8 shows a photographic plan view of a valve device according to an embodiment of the present invention.

FIG. 8 shows a photograph of the fabricated device. The Parylene platform technology has been described in connection with FIGS. 1–5 above, where the process uses Parylene (4 layers) as the mechanical material, photoresist and sputtered silicon as the sacrificial material and Cr/Au as electrode material. As shown, a 300 nm gold bottom electrode has been patterned on oxide. A 150 nm gold top electrode was sandwiched between two Parylene layers. Between two electrodes are 300 nm silicon and 4 µm photoresist sacrificial layers. Another 5 µm photoresist and 4 µm Parylene layers then defined the fluid channel.

The photoresist was free etched by acetone followed by rinsing with isopropyl alcohol. Etching of the silicon with gaseous $BrF_3$ was to free the membranes without resulting stiction. Note that the overall technology has been done under low temperature (<120° C.) so it's fully post-CMOS compatible.

A 5 kHz AC drive signal was used in the electrostatic actuation, which eliminates DC charging and stiction problems. Peak voltage of the drive signal is 100–200V. The pull-in voltage depends on membrane thickness and diameter. For a typical 200-μm-diameter and 2-μm-thick Parylene membrane, the pull-in voltage is about 150V. We have performed both 3 and 6-phase peristaltic actuation. See, for example, "A Thermopneumatic Peristaltic Micropump", C. Grojean, X. Yang and Y. C. Tai, Transducers, pp.1776–1779 (1999), incorporated herein by reference for all purposes.

Figure 9:
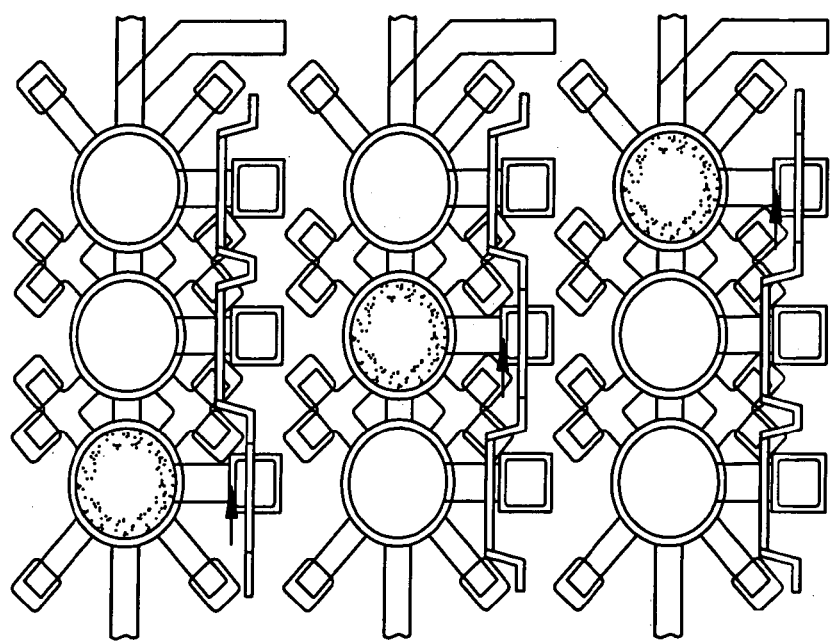
FIG. 9 shows a photographic plan view of an actuated device according to an embodiment of the present invention.

For pumping, a 1–70 Hz control signal controls the actuation sequence or phase. FIG. 9 shows the actuation of the micro pump using the 3-phase sequence. The voltage is 150V, and the frequency is 6 Hz.

Figure 10:
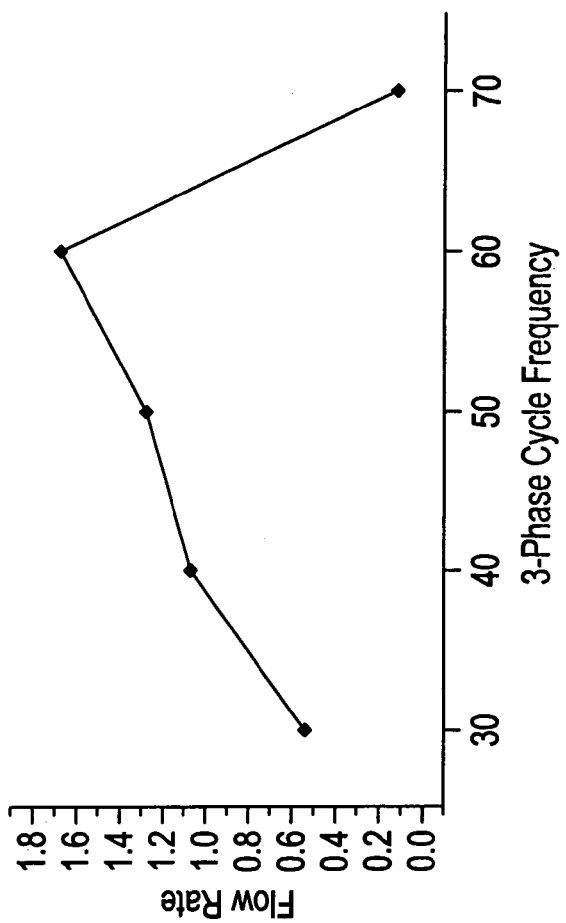
FIG. 10 plots flow rate versus cycling frequency for one embodiment of the present invention.

To facilitate visualization, micron-sized beads are put inside the fluid to measure pumping rate. FIG. 10 then shows the pumping rate vs. actuation frequency where 60 Hz is the optimal frequency.

Figure 11A:
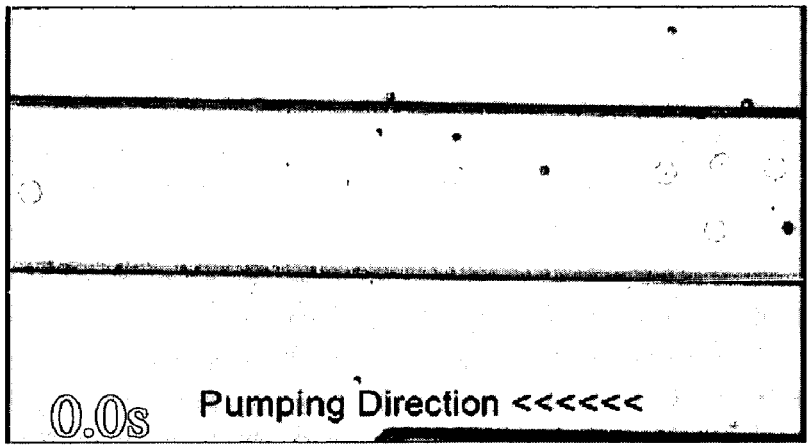
FIGS. 11A–C are photographs showing the pumping achieved by one embodiment of the present invention.
Figure 11B:
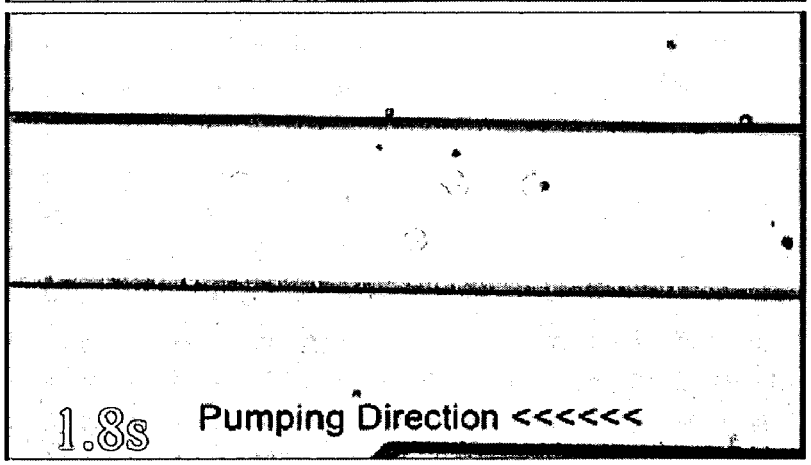
Figure 11C:
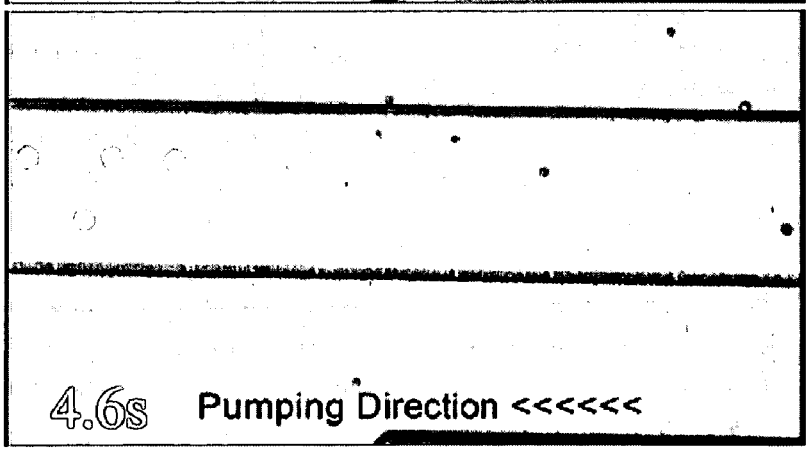

FIGS. 11A–C shows sequential snapshots of a pumping test. The pump has been actuated at 140Volts, 60 Hz using a 3-Phase signal at times 0, 1.8 sec, and 4.6 sec, respectively. Bead velocity is measured as 100 μm/sec, which translates to a flow rate of 2 nanoliters/min. As shown, we have demonstrated aspects of the present system and method. Of course, there can be other variations, alternatives and modifications.

The above description relates to only to particular embodiments, to which the present invention is not limited. For example, while the above description indicates that one or more of the polymer based layers may be formed by deposition of Parylene material, the present invention is not limited to this particular embodiment. In accordance with alternative embodiments, one or more polymer based layers may be formed by injection molding of thermoplastics and the like. Of course, there can be other variations, modifications, and alternatives.

Moreover, while the above description focuses upon the fabrication and operation of a pumping structure, embodiments in accordance with the present invention are not limited to this particular embodiment. For example, in accordance with alternative embodiments of the present invention, the fluidic structure may be employed as a valve.

Specifically, the above-described structure allows the height of a flow channel/chamber to be altered by actuation of a second electrode in the direction of a first electrode. As described above, such movement can be utilized to achieve pumping of fluid through the flow channel or chamber. Such movement can also be utilized to regulate flow in the manner of a valve.

Specifically, the flow resistance encountered by fluid flowing through the structure is determined in part by the height of the constriction. By actuating the second electrode to thereby vary the height of the flow chamber/channel, valving activity can be achieved, and the amount of fluid flow regulated.

In certain applications, imposing an electric field across the flow chamber/channel can have an adverse impact, for example where the contents of the flow channel are subject to electrolysis or are otherwise sensitive to changes in electric field. By positioning both electrodes on the same side of the flow chamber/channel, a valve design in accordance with an embodiment of the present invention offers the advantage of regulating flow rate without exposing the contents of the flow chamber/channel to a substantial applied electric field.

It is also understood that the examples and embodiments described herein are for illustrative purposes only, and there can be other variations and alternatives. Various modifications or changes in light of the above description thereof will be suggested to persons skilled in the art and are to be included within the spirit and purview of this application and scope of the appended claims.

What is claimed is:

1. An electrostatic fluid regulating device comprising a plurality of fluid regulating elements numbered from 1 through N disposed on a substrate; each of the fluid regulating elements comprising:
    a fluid channel comprises an inlet at a first end and an outlet at a second end, the fluid channel being disposed overlying the substrate;
    an actuation region disposed overlying the substrate and coupled to the fluid channel;
    a polymer based diaphragm coupled between the fluid channel and the actuation region;
    a first electrode coupled to the substrate and to the actuation region; a second electrode coupled to the polymer based diaphragm; an electrical power source coupled between the first electrode and the second electrode and substantially free from causing an electric field within the fluid channel region; and
    wherein the first electrode and the second electrode are physically separated from each other by at least the actuation region, and wherein the first electrode and the second electrode provide electrode movement to vary the height of the fluid channel when a potential difference arises between them.

2. The device of claim 1 wherein the fluid device is a pump.

3. The device of claim 1 wherein the fluid channel contains liquid.

4. The device of claim 1 wherein the fluid channel contains gas.

5. The device of claim 1 wherein the actuation region contains gas.

6. The device of claim 1 wherein the actuation region contains electronic liquid including fluorinate.

7. The device of claim 1 wherein each of the fluid channels of each of the respective fluid regulating elements is coupled with each other in a serial manner.

8. The device of claim 1 wherein each of the fluid channels of each of the respective fluid regulating elements is coupled with each other in parallel.

9. The device of claim 1 wherein the plurality of the fluid regulating elements are actuated in a peristaltic manner.

10. The device of claim 1 wherein each of the fluid channels is characterized by a height of less than 5 microns.

11. The device of claim 1 wherein the height of the fluid channels is equal or larger than 5 micron.

12. The device of claim 1 wherein each of the polymer based diaphragms is characterized by a diameter ranging from 10 to 1000 micron.

13. The device of claim 1 wherein the polymer based diaphragm is characterized by a diameter that is larger than 1000 microns.

14. The device of claim 1 wherein the polymer based diaphragm is characterized by a thickness ranging from 0.1 to 10 microns.

15. The device of claim 1 wherein the polymer based diaphragm is characterized by a thickness of greater than 10 microns.

16. The device of claim 1 wherein the second electrode is embedded within the polymer based diaphragm.

17. The device of claim 1 wherein the substrate is made of a material selected from silicon or glass.

18. The device of claim 1 wherein the electrode comprises a material selected from the group consisting of gold, aluminum, platinum, chrome, titanium, and doped polysilicon.

19. The device of claim 1 wherein the polymer based diaphragm comprises a material selected from the group consisting of Parylene, polyimide, and silicone.

20. The device of claim 1 wherein the actuation regions of the plurality of fluid-regulating elements are connected and sealed.

21. The device of claim 1 wherein the fluid device is a valve.

22. A method of flowing a fluid comprising:
providing an electrostatic fluid regulating device comprising a plurality of fluid regulating elements numbered from 1 through N disposed on a substrate, each of the fluid regulating elements comprising,
   a fluid channel comprises an inlet at a first end and an outlet at a second end, the fluid channel being disposed overlying the substrate,
   an actuation region disposed overlying the substrate and coupled to the fluid channel,
   a polymer based diaphragm coupled between the fluid channel and the actuation region, and
   a first electrode coupled to the substrate and to the actuation region;
   a second electrode coupled to the polymer based diaphragm such that the first electrode and the second electrode are physically separated from each other by at least the actuation region; and
applying electrical power from a source in a sequence to create a potential difference between the first and second electrodes of first, second, and third fluid regulating elements in turn, the first and second electrodes provide electrode movement to vary the height of the fluid channel when a potential difference arises between them such that contents of the fluid channel region are substantially free from an applied electric field.

23. The method of claim 22 wherein providing the electrostatic fluid regulating device comprises providing three fluid regulating elements.

24. The method of claim 23 wherein applying electrical power comprises applying electrical power to a first fluid regulating element, and then applying electrical power to a second fluid regulating element proximate to the first fluid regulating element, and then applying electrical power to a third fluid regulating element, the second fluid regulating element positioned between the first and third fluid regulating elements.

25. The method of claim 22 wherein applying electrical power results in a peristaltic pumping action of the fluid regulating elements.

26. The method of claim 22 wherein providing the second electrode comprises providing the second electrode sandwiched between layers of Parylene.

27. The method of claim 22 wherein applying electrical power to create a potential difference between the first and second electrodes causes the second electrode and diaphragm to be drawn toward the first electrode and the actuation region.

* * * * *